United States Patent
Bingham

[11] Patent Number: 5,912,825
[45] Date of Patent: Jun. 15, 1999

[54] GATED BASE LINE RESTORER SYSTEM

[75] Inventor: Russell David Bingham, Knoxville, Tenn.

[73] Assignee: EG&G Instruments, Inc., Oak Ridge, Tenn.

[21] Appl. No.: 08/807,754

[22] Filed: Feb. 27, 1997

[51] Int. Cl.$^6$ .............................. G06F 17/00; H03F 1/00; G01T 1/22

[52] U.S. Cl. ................ 364/724.011; 250/252.1; 330/305

[58] Field of Search ............. 364/724.16, 724.011, 364/724.19, 724.2, 734, 811; 375/233, 200

[56] References Cited

U.S. PATENT DOCUMENTS

| | | | |
|---|---|---|---|
| Re. 30,904 | 4/1982 | Miller et al. ................ | 250/370.09 |
| 3,949,206 | 4/1976 | Edwards et al. ............ | 364/724.16 |
| 4,055,766 | 10/1977 | Miller et al. ................ | 250/370.09 |
| 4,061,919 | 12/1977 | Miller et al. ................ | 250/363.02 |
| 4,193,118 | 3/1980 | Nash et al. .................. | 364/734 |
| 4,866,400 | 9/1989 | Britton, Jr. et al. ......... | 330/305 |
| 5,285,475 | 2/1994 | Kurokami .................... | 375/233 |
| 5,353,306 | 10/1994 | Yamamoto .................... | 375/233 |
| 5,440,503 | 8/1995 | Maruyama .................... | 364/724.1 |
| 5,692,006 | 11/1997 | Ross ............................. | 375/200 |

*Primary Examiner*—Hassan Kizou
*Assistant Examiner*—Douglas S. Lee
*Attorney, Agent, or Firm*—Iandiorio & Teska; Erik Fako

[57] ABSTRACT

A digital gated base line restorer system for an ionizing radiation spectroscopy device includes a gated base line restorer circuit, responsive to pulses passing through the device, for generating a weighted average of previous base line sample points and applying it to the pulses to compensate for base line offset errors; and a control circuit responsive to the pulses passing through the device, to enable the gated base line restorer circuit to generate the weighted average during intervals between the pulses and applying it during the random pulses.

18 Claims, 7 Drawing Sheets

GATED BASE LINE RESTORER SYSTEM

FIELD OF INVENTION

This invention relates to a digital gated base line restorer system, and more particularly to such a system particularly adapted for use in conjunction with a shaping filter in an ionizing radiation spectroscopy system.

BACKGROUND OF INVENTION

Radiation detection systems generally employ a radiation detector such as a germanium or scintillation detector to detect radiation from a radiation source such as alpha or gamma rays. The detection of such energy results in a charge pulse whose amplitude is proportional to the energy of the incident radiation. The charge pulse is converted to a voltage pulse by a charge sensitive preamplifier. The voltage pulse is filtered with an analog or digital filter to improve the accuracy and precision of the measurement and the amplitude of the resulting pulse is measured. Usually the measured value is histogrammed to form a spectrum which indicates the number of pulses of a particular amplitude which have been processed by the system as a function of the amplitude of the pulse.

Since the measured amplitude of the pulse is proportional to the energy of the incident radiation, the spectrum may also be interpreted to indicate the number of alpha or gamma-rays of a particular energy which have been processed by the system as a function of the energy of the incident radiation. To make this conversion between measured amplitude and energy, a radiation source of known characteristics is analyzed by the detection system. Since the construction of the radiation source is known features in the spectrum can be used to calibrate the detection system. For example, if a CO-60 source is analyzed by a detection system, two peaks will appear in the spectrum. The energy of the higher peak is known to be 1332.5 keV and the energy of the lower peak is known to be 1173.237 keV. With this information, a mapping can be made between the measured amplitude of the pulse and the energy of the incident radiation.

Once this calibration has been made, it is desirable for the system to be sufficiently stable such that the calibration remains valid for long periods of time. Ideally the calibration would never change. Unfortunately, in real world systems the measured amplitude changes with varying conditions due to changes in the environment and also due to changing intensity of the radiation source. Such changes can be either gain errors or offset errors.

A circuit which has been widely used in analog systems to eliminate the offset errors is the gated-base line restorer. A gated-base line restorer is a time-variant circuit which averages the output from the filter when no pulses are being processed by the filter and subtracts the resulting average from the output of the filter. When pulses are being processed by the filter, the average holds its current value. By using this gated approach, the shape of the output pulse is not disturbed by the restorer, yet any offset errors in the system are effectively removed.

In a system which has a digital filter, the shifts in offset are reduced due to the ideal nature of digital circuits; however shifts from the preamplifier and sampling circuit would still cause offset shifts at the output of the digital filter.

Georgiev and Gast, *IEEE Trans. on Nucl. Sci.* Vol. 40, No. 4 (August 1993), have pointed out one technique for performing this function digitally in which a moving average is used to determine the amount of offset error to remove. In this circuit, all base line points are weighted equally regardless of how old the points are.

SUMMARY OF INVENTION

It is therefore an object of this invention to provide an improved gated base line restorer system.

It is a further object of this invention to provide an improved digital gated base line restorer system.

It is a further object of this invention to provide such an improved digital gated base line restorer system which generates a weighted average for compensating for base line offset errors.

It is a further object of this invention to provide an improved digital gated base line restorer system, which employs a simpler, more versatile weighted averaging technique.

It is a further object of this invention to provide an improved digital gated base line restorer system which weights older sample points less than more recent sample points.

It is a further object of this invention to provide an improved digital gated base line restorer system which includes a large number of sample points to improve accuracy but does so quickly and efficiently.

It is a further object of this invention to provide an improved digital gated base line restorer system which uses a simple feedback technique to perform the weighted average over time.

It is a further object of this invention to provide an improved digital gated base line restorer system in which the weighted feedback coefficient can be easily varied to vary the time constant of the weighted average.

The invention results from the realization that an improved base line restorer circuit can be achieved by weighting the prior sample points so that older points are weighted less and by using a feedback technique to generate a weighted average of all prior sample points in which the feedback weighting coefficient is easily varied to provide a desired time constant for the weighted average and that a truly simplified base line restorer circuit including only a multiplier and switch can be achieved by merging it with the output stage of a digital shaping filter.

This invention features a digital gated base line restorer system for an ionizing radiation spectroscopy device. There is a gated base line restorer circuit responsive to pulses passing through the device for generating a weighted average of previous base line sample points and applies it to the pulses to compensate for base line offset errors. A control circuit responsive to the pulses passing through the device enables the gated base line restorer circuit to generate the weighted average during intervals between the pulses and apply it during the pulses.

In a preferred embodiment the gated base line restorer circuit may include a weighted averaging circuit for generating the weighted average and an adjustment circuit for applying the weighted average.

In one embodiment the weighted averaging circuit may include a delay device for accumulating a number of previous sample points, a weighting device for weighting each previous sample point with a different weighting factor, a summing device for combining differently weighted previous sample points, and an averaging device for providing the average of the differently weighted previous sample points. The delay device may include a shift register. The weighting device may include a plurality of multiplier circuits, one for each weighting factor. The summing device may include an algebraic summing circuit.

In another embodiment the averaging device may include a multiplier circuit for applying a normalizing factor of the reciprocal of the sum of the weighting factors. The adjustment circuit may include the summer device. The summer device may include an algebraic summer circuit. In another embodiment the weighted averaging circuit may include a first delay circuit for delaying the sampling points, a summing circuit having one input for receiving the once delayed sample point from the first delay circuit, a second delay circuit responsive to the output of the summing circuit for feeding back a twice delayed sample point to the second input of the summing circuit, and a weighting circuit for applying a weighting factor to the twice delayed sample point delivered to the second input of the summing circuit whereby more recent sample points are weighted more than older sample points. The weighted averaging circuit may include an averaging circuit responsive to the summing circuit for providing an average of the summed weighted sample points for generating the weighted average for applying to the digital pulses. The weighting factor may be less than one. The gated base line restorer circuit may include a differencing device for determining the difference between each present sample point and a previous sample point and a weighting network for generating a weighted average of previous sample points and combining that weighted average with the difference between ample points and applying it to the digital pulses. The differencing device may include first delay means for delaying the sample points and summing means for subtracting the past sample points from the present sample point to obtain the difference. The weighting network may include a second summing means having one input responsive to the difference between the sample points and second delay means responsive to the output of the second summing means for feeding back the delayed difference to a second input of the second summing means and a weighting component for applying a weighting factor to the delayed difference delivered to the second input of the second summing means for reducing the difference exponentially. The weighting network may include switch means responsive to the control circuit for applying the weighting factor only during sample points occurring during base line periods between the pulses.

In another embodiment the system may include a shaping filter with an output stage having a summer element followed by a delay element and the gated base line restorer circuit may include a weighting element for weighting the output of the filter and feeding it back to the summer element for producing a weighted average of base line sample points and applying it to the pulses to compensate for base line offset errors. The weighting element may include a switching circuit responsive to the control circuit for applying the weighting factor only during base line periods between the pulses.

The weighted averaging circuit may include a feedback circuit for recirculating a function of the base line restorer circuit outputs and weighting them diminishingly with time.

DISCLOSURE OF PREFERRED EMBODIMENT

Other objects, features and advantages will occur to those skilled in the art from the following description of a preferred embodiment and the accompanying drawings, in which.

Figure 1:
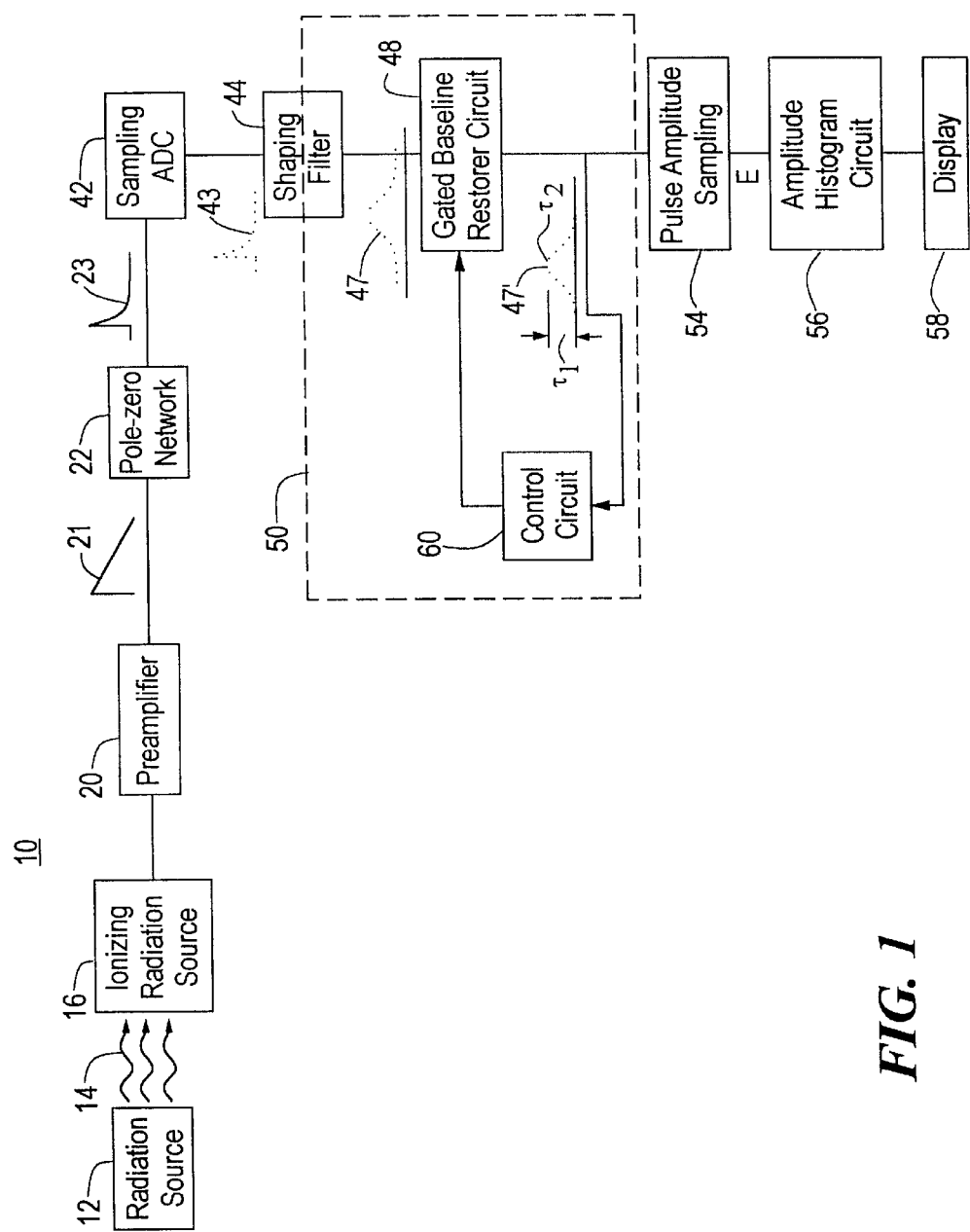
FIG. 1 is a schematic block diagram of a gated base line restorer system according to this invention in an ionizing radiation spectroscopy device.

There is shown in FIG. 1 an ionizing radiation spectroscopy device 10 including a digital gated base line restorer circuit according to this invention. A radiation source 12 provides radiation such as alpha or gamma rays 14 which is detected by an ionizing radiation detector 16, for example, where it is converted to charge which is submitted to preamplifier 20. Preamplifier 20 converts the charge to a voltage pulse 21 which is typically exponential in shape and has a decay time constant defined as $\tau_{preamp}$. The output of preamplifier 20 may be delivered directly to sampling analog to digital converter 42 or it may first be passed through pole-zero network 22. At the output of pole-zero network 22, pulse 23 now has a reduced time constant $\tau_{in}$ as it is submitted to sampling ADC 42. If a pole-zero network is not included, the input to sampling ADC 42 would still be exponential in shape; however, the decay time constant would be longer. Sampling ADC 42, samples and converts analog signal 23 to a digital signal 43 and submits it to shaping filter 44. Shaping filter 44 transforms the exponentially shaped pulse into a pulse 47 which has better characteristics for accurately determining the amplitude of the pulse. Pulse 47 typically has a flat top with a cusp shape during the rise and fall times as shown on waveform 47. Pulse 47 is delivered to the gated base line restorer circuit 48 which operates on pulse 47 to remove any offsets in the waveform to produce base line restorer pulse 47': While prior to submission to gated base line restorer circuit 48 pulse 47 having a value E appears offset by an amount $V_B$, it can be seen that at the output of gated base line restorer circuit after the weighted average correction has been applied the signal 47' still having a value E, has been correctly restored to the base line value whereby offset $V_B$ has been removed.

Control circuit 60 monitors the output of the gated base line restorer circuit 48 to determine when pulses are being analyzed by the system. The control circuit then provides a control signal to the gated base line restorer circuit 48, causing the restorer operation to become inactive when a pulse is being processed. That is, control circuit updates the gated base line restorer circuit between pulses and applies the updated correction signal during the pulses to bring the pulses back to the proper base line as will be explained hereinafter. Gated base line restorer system circuit 48 and control circuit 60 together form the gated base line restorer system 50 of this invention. In one embodiment the gated base line restorer circuit 48 is actually included in the last stage of shaping filter 44 s discussed infra with respect to FIG. 8.

Control circuit 60 may be as simple as a thresholding circuit which determines that the output waveform is greater than the noise level of the system. However, for improved operation a fast amplifier and threshold circuit is often used to analyze the input to the shaping filter to provide early warning that a pulse is about to be sent through the filter.

The output of gated base line restorer system 50 is submitted to pulse amplitude sampling circuit 54 which determines the amplitude of each pulse leaving the gated base line restorer system 50. That amplitude is then passed to the amplitude histogram circuit 56 which forms a histogram of the amplitude. That histogram is delivered to a display device 58.

Figure 2:
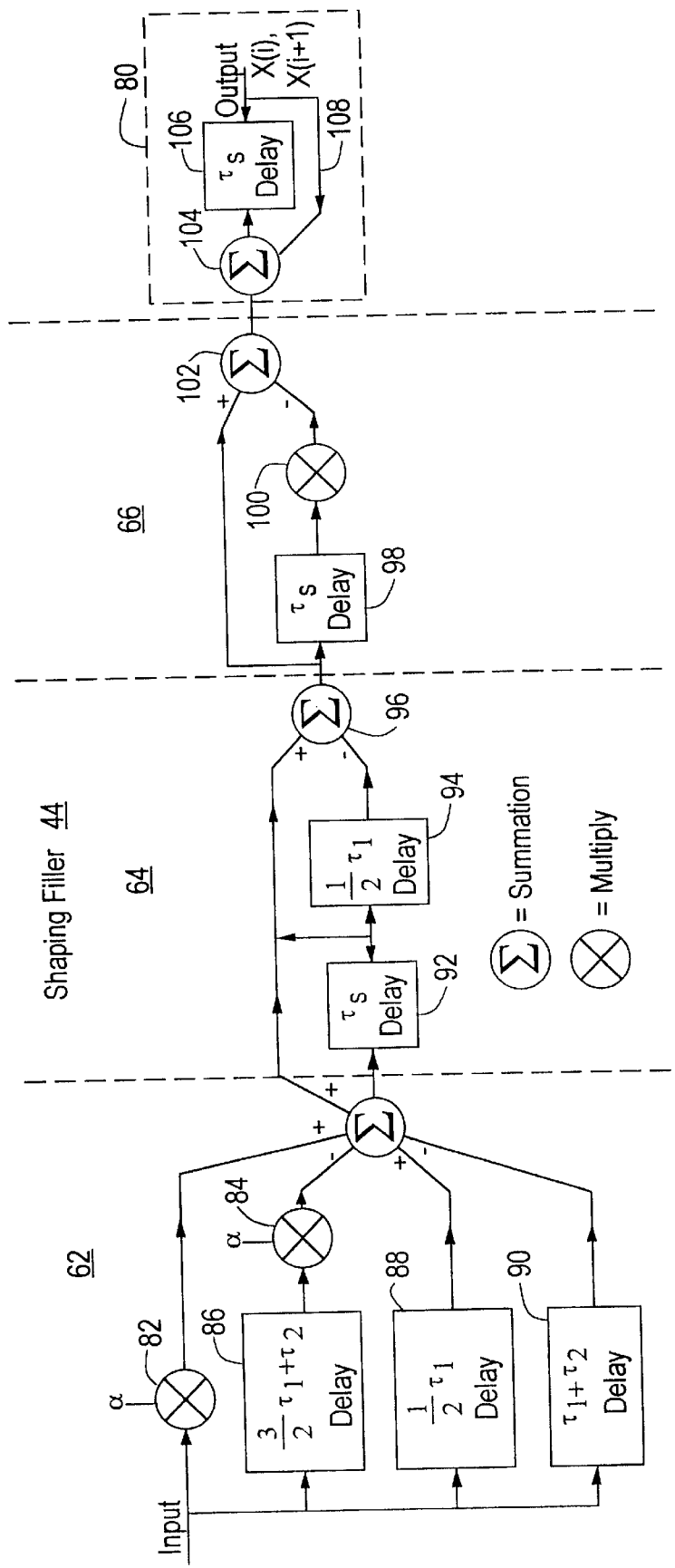
FIG. 2 is a more detailed schematic block diagram of the shaping filter in FIG. 1.

Shaping filter 44, FIG. 2, is typically a conventional shaping filter having four stages: input stage 62, intermediate stages 64 and 66, and output stage 80. The implementation of shaping filter 44 in FIG. 2 is conventional in nature and forms no part of this invention. The first stage 62 includes two multipliers 82, 84 which introduce coefficient α that is a constant that can be used to control the shape of the output pulse. Also included at input stage 62 are four delay circuits 86, 88, 90 and 92 which may be simply shift registers or the equivalent. Delay circuit 86 introduces the delay $3/2\tau_1 + \tau_2$, delay circuit 88 introduces the delay $\frac{1}{2}\tau_1$, and delay circuit 90 introduces the delay $\tau_1 + \tau_2$. $\tau_1$ is the rise time of the output pulse, $\tau_2$ is the width of the flat top of the output pulse 47 as indicated on pulse 47 in FIG. 1. Delay circuit 92 introduces delay $\tau_S$ which is the sampling time of analog to digital converter 42. Intermediate stage 64 includes delay circuit 94 and a summing circuit 96. Delay circuit 94 introduces a delay $\frac{1}{2}\tau_1$. The second intermediate stage 66 includes delay circuit 98, multiplier 100 and summing circuit 102, delay circuit 98 introduces the delay $\tau_S$, and multiplier 100 multiplies the output by a factor of $$e^{-\frac{\tau_S}{\tau_{in}}}.$$

This coefficient causes the output pulse to more closely match the input exponential of pulse 23 to the sampling ADC. The last stage or output stage of shaping filter 44 receives at its input the signal V(i) and produces at its output the ultimate output of shaping filter 44 Y(i). Output stage 80 includes summing circuit 104 and delay circuit 106 whose output is fed back over line 108 to the other input to summing circuit 104. Output stage 80 uses summer 104 to receive input V(i) and add to it the last previous input which is now appearing as output X(i) to make it the next output X(i+1). Output stage 80 of this operation is noteworthy as it will be referred to again with reference to FIG. 9 and the simplest implementation of this invention.

Figure 3:
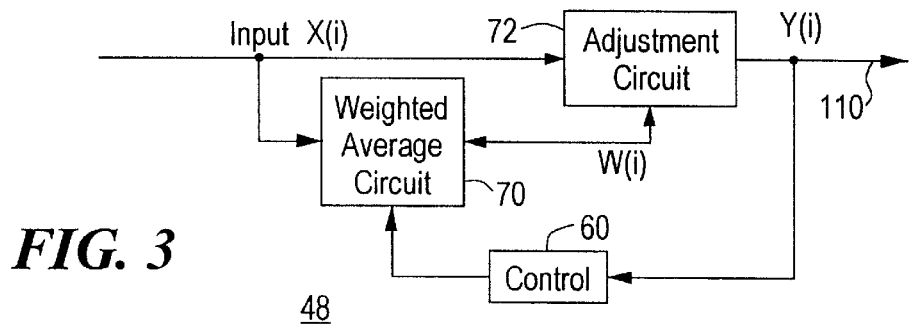
FIG. 3 is a more detailed block diagram of the gated base line restorer circuit of FIG. 1.

Gated base line restorer circuit 48 includes weighted averaging circuit 70, FIG. 3, and adjustment circuit 72. In operation, the input, typically denominated X(i), is delivered to adjustment circuit 72 where any offset in the base line is corrected by weighted average W(i) before Y(i) is finally delivered at the output 110.

Control 60 monitors the output Y(i) on line 110 and allows the weighted averaging circuit 70 to update the weighted average correction signal W(i) between the occurrence of the digital pulses during the base line period and then applies that weighted average correction W(i) through the adjustment circuit during the appearance of the digital pulses. In one implementation, adjustment circuit 72 may include simply summing circuit 112, FIG. 4.

Figure 4:
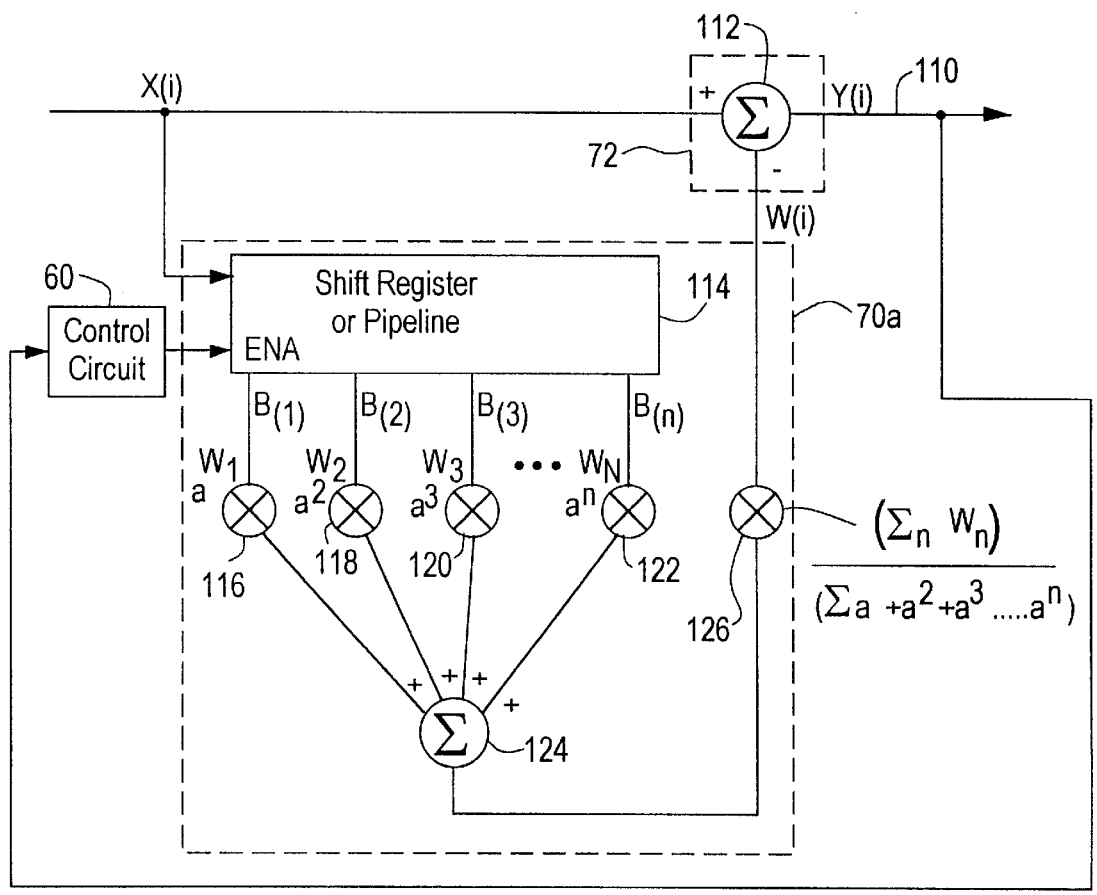
FIG. 4 is a more detailed schematic diagram of one embodiment of the weighted average circuit of FIG. 3.

In one embodiment, FIG. 4, weighted average circuit 70 may include a shift register or a pipeline register 114 which receives the input signal X(i) and is enabled between digital pulses during the base line period by a signal at its enable input from control circuit 60. Each of the delayed outputs of X(i) denominated $B_1$, $B_2$, $B_3$, $B_n$, is delivered to a shift register or pipeline register 114. Each of the delayed outputs $B_1$, $B_2$, $B_3$, $B_n$, is submitted to a multiplier 116, 118, 120, 122, where it is multiplied by a weighting factor $W_1$, $W_2$, $W_3$, $W_n$. In this way each of the sample points contained in delay line or shift register or pipeline register 114 can be weighted with a different coefficient and the coefficients may be graded so that the older a delayed sample point is, the less weight it will be given. The outputs of all of the multipliers 116–122 are combined in summing circuit 124 and then averaged by multiplying them in multiplier 126 by a factor which is equivalent to the reciprocal of the summation of all the coefficients $W_1$, $W_2$, $W_3$, $W_n$. The weighted average signal W(i) is then subtracted in summing circuit 112 from the input X(i) to obtain the output Y(i) which has been restored to the proper base line at output 110.

Typical implementation of multipliers 116–122 would use a coefficient "a" which is less than 1. Thus $W_1$ at multiplier 116 would be a, $W_2$ at multiplier 118 could be $a^2$, $W_3$ could be $a^3$, and $W_n$ could be $a^n$. Multiplier 126 would then multiply the summed output from summing circuit 124 by a factor of 1 over the sum of $a + a^2 + a^3 + \ldots + a^n$ to obtain weighted average signal W(i) which is submitted to the negative input of summer circuit 112. Input signal X(i) is delivered directly to summing circuit 112 of adjustment circuit 72, whose output is the output signal Y(i) on line 112.

Figure 5:
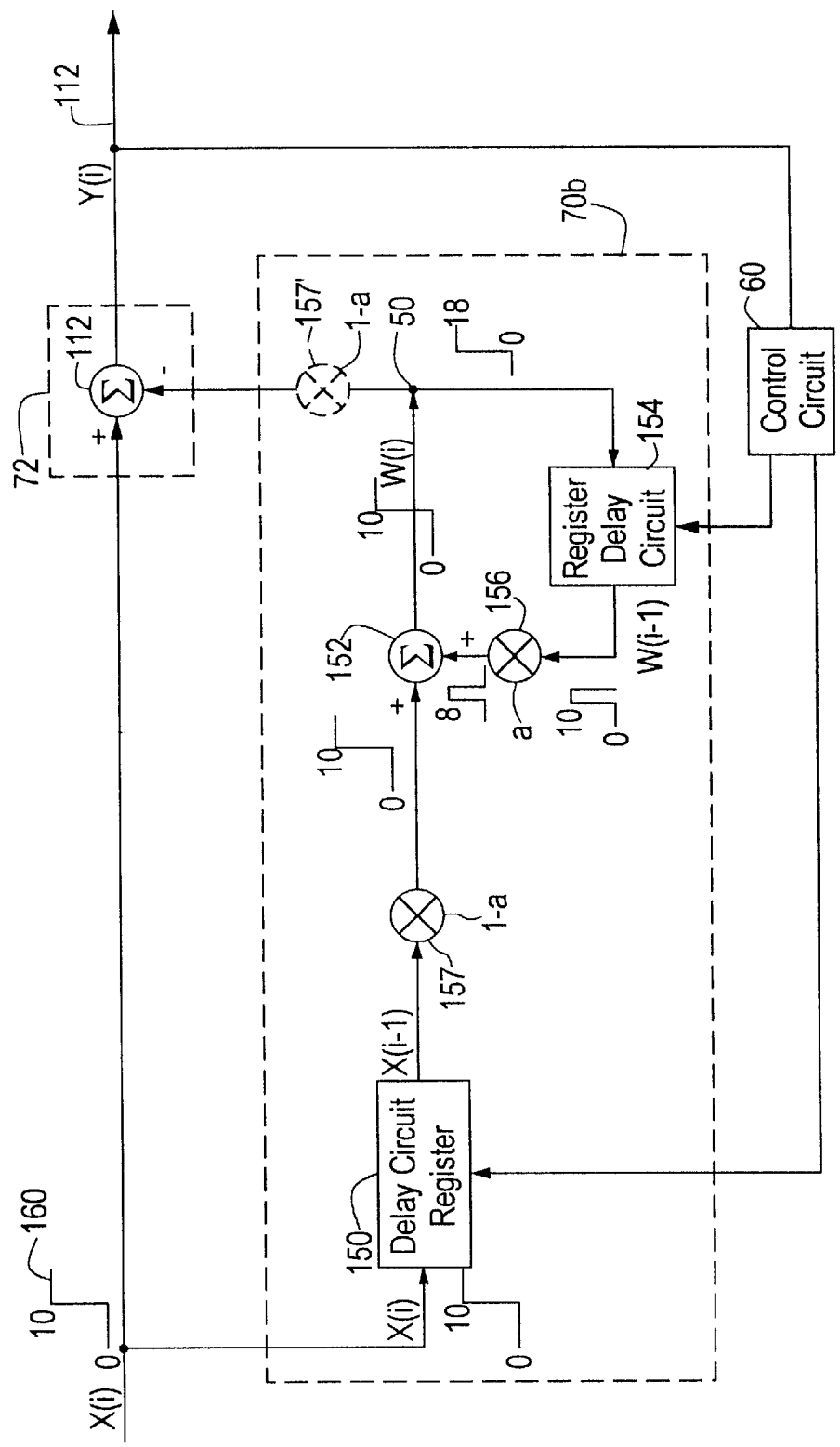
FIG. 5 is a more detailed schematic diagram of another embodiment of the weighted averaging circuit of FIG. 3 using feedback to perform the weighting function.

In another embodiment of weighted average circuit 70b, FIG. 5, input signal X(i) is delivered to the positive input of summing circuit 112 and is also delivered to delay circuit or register 150. The output X(i) once delayed or X(i-1) is scaled by multiplier 157 and delivered to summing circuit 152. The output of summing circuit 152 is the weighted average W(i) which is fed directly into the negative input of summing circuit 112 so that the weighted average is subtracted directly from the input signal X(i) to obtain the output signal Y(i). In order to provide the weighted average in this feedback system the weighted average W(i) is fed back through delay circuit or register 154. The once delayed weighted average signal W(i-1) is then delivered to multiplier circuit 156 where it is multiplied by a factor a which is less than 1. The output of multiplier 156 is then delivered to the other input of summing circuit 152. Register or delay circuit 154 and delay circuit or register 150 are both operated by control circuit 60 so that they accept sample points only during the base line portion of input signal X(i) and not during the period when there are pulses present. An averaging circuit, multiplier 157 is provided between register or delay circuit 150 and summing circuit 152 wherein the once delayed input signal X(i-1) is multiplied by 1-a. This circuit could also be applied as shown in dashes at 157' between the output of summing circuit 152 and the input to summing circuit 112. The advantage of using a feedback loop to provide the weighted average is not just that it is simpler. It of course does eliminate much circuitry, but it also provides a summation of all pulses that historically occurred in the circuit, not just a limited number of previous pulses. In addition, the coefficient a can be changed in order to vary the restoration time or time decay time or time constant of the restoration signal in dependence upon the frequency of the incoming pulses.

A clearer understanding of the operation of weighted average circuit 70b may be obtained by a simple example. Assume the base line X(i) is constantly at zero and then suddenly jumps to a value ten as shown by waveform 160.

This ten will be applied directly to summing circuit 112. It also is applied through delay circuit 150 to multiplier 157 which multiplies the waveform by 1−a. Supposing a has a value of 0.8, the signal at the output of multiplier 157 would be 10(1−0.8) or 2. This value is submitted to summing circuit 152. From the output of circuit 152 that waveform of level two is submitted through register or delay 154 to multiplier 156. Supposing coefficient a has a value of 0.8, the signal out of multiplier 156 will now be 1.6 into summer 152. This would be summed with the incoming two from multiplier 157 for a total of 3.6. The 3.6 is now fed back through register 154, multiplied by 0.8, and now becomes 2.88. It is added in summer 152 to the level two which is still present and we assume will be present forever in this example, so that total out W(i) is now 4.88. This gets fed back again and again. After a few cycles the output W(i) of summing circuit 152 approaches 10. The ten at the negative input of summing circuit 112 combined with the ten at the plus input of 112 cancels out so that the base line has been restored to zero. Coefficient a can be changed to be closer to 0 if it is desired to have a faster time constant should there be a high incidence of radiation detections, or it can be raised if the pulses are occurring more slowly. If the time constant introduced by coefficient a is too slow it will distort the base line restoration process when the pulses are coming fast and closely spaced. However, if the time constant is too fast, noise could be introduced which provides another source of error. Thus by having one coefficient control the entire weighted average operation, it is simple to adjust the weighted averaging protocol to suit the particular conditions.

Figure 6:
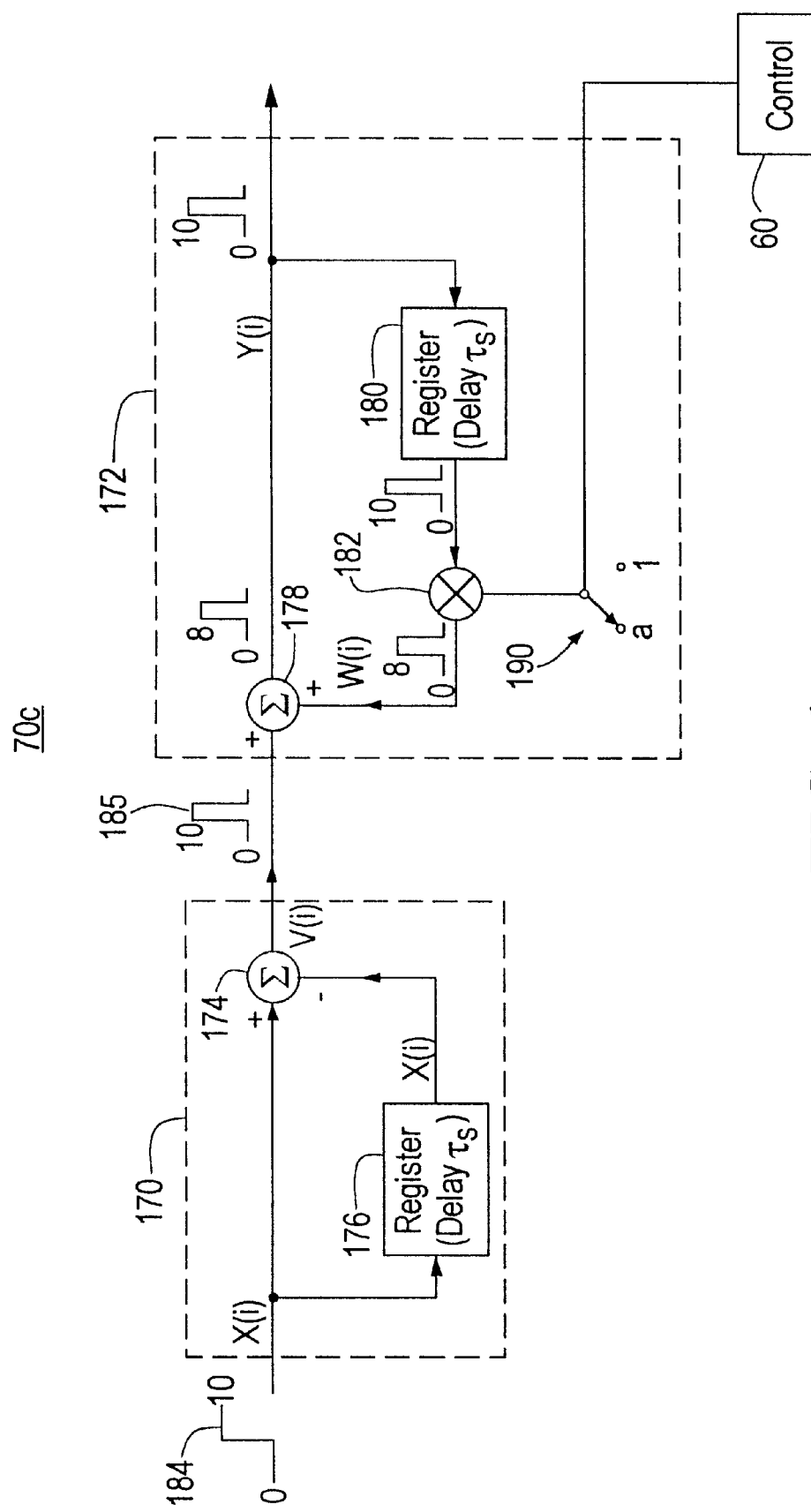
FIG. 6 is a more detailed schematic diagram of yet another embodiment of the weighted averaging circuit of FIG. 3 using feedback to perform the weighting function.

In yet another embodiment, FIG. 6, gated base line restorer circuit 70c includes differencing circuit 170 and weighting circuit 172. Differencing circuit 170 determines the difference between the present signal and the last signal in summing circuit 174 and provides the output V(i) to weighting circuit 172. Assuming that the previous signal was X(i) and has been passed through register or delay circuit 176 which introduces delay $\tau_S$, then the present input signal is X(i+1) and this will be fed to summing circuit 174. With X(i) at the negative input of summing circuit 174 and X(i+1) at the positive input of summing circuit 174, the output is the difference, denominated V(i). This V(i) output is delivered to summing circuit 178 in weighting circuit 172. The output of summing circuit 178 on line 112 is directly noted as the output Y(i). This output is fed back through register or delay circuit 180 which provides the time delay $\tau_S$ to multiplier 182 where it is multiplied by the coefficient a and delivered through the other positive input to summing circuit 178. Thus any difference that occurs at input signal X(i+1) will appear at the output of summing circuit 174 and cause the feedback loop of delay circuit 180 and multiplier 182 to generate a correction signal which will after a few iterations cancel or correct the offset.

For example, again suppose a normal base line signal of zero suddenly jumps to a level ten as shown at input waveform 184. This will provide a pulse 185 of very short duration at the output of summing circuit 174 representing the moment at which the base line level jumped from zero to ten. While it was zero, there would be no difference to appear at the output of summing circuit 174. After it reached a steady state of ten, again there would be no difference, for the output pulse at summing circuit 74 would only be present for that period. That pulse circulated through time delay circuit 180 in multiplier 182 would be multiplied by a coefficient a. Again, assuming coefficient a is 0.8, the level ten pulse submitted to multiplier 182 would be output as a pulse having a level 8, that would now be added in summer 178 to a level zero since the solitary ten level pulse has already passed through. Thus the output at the second iteration from summing circuit 178 is 8. As the 8 returns through register 180 and multiplier 182 it becomes 6.4, where it is added in 178 to the input 0 to provide an output of 6.4. After a few iterations it can be seen that the base line is again approaching zero, as it should be in accordance with the operation of this circuit.

Control 60 operates switch 190 so that during the base line periods between pulses the sample points are multiplied by the factor a, whereas during the occurrence of the digital pulses themselves the sample points are multiplied by the factor 1 and thus have no effect on the pulses.

A truly elegant and surprising solution occurs now if one compares the circuits in FIG. 6 with the circuit in FIG. 2. In FIG. 2 output stage 80 receives at its input signal V(i) and provides at its output the signal X(i). In FIG. 6 differencing circuit 170 receives at its input signal X(i+1) and puts out V(i). Thus these two circuits are the reciprocal of one another and actually cancel each other out so that they can be eliminated, one from the shaping filter in FIG. 2, the other from the base line restorer circuit in FIG. 6, without any effect except to save substantial hardware. Output stage 80 in FIG. 2 receives the input signal V(i) and adds to it the output signal X(i) to get the next output X(i+1).

Figure 7:
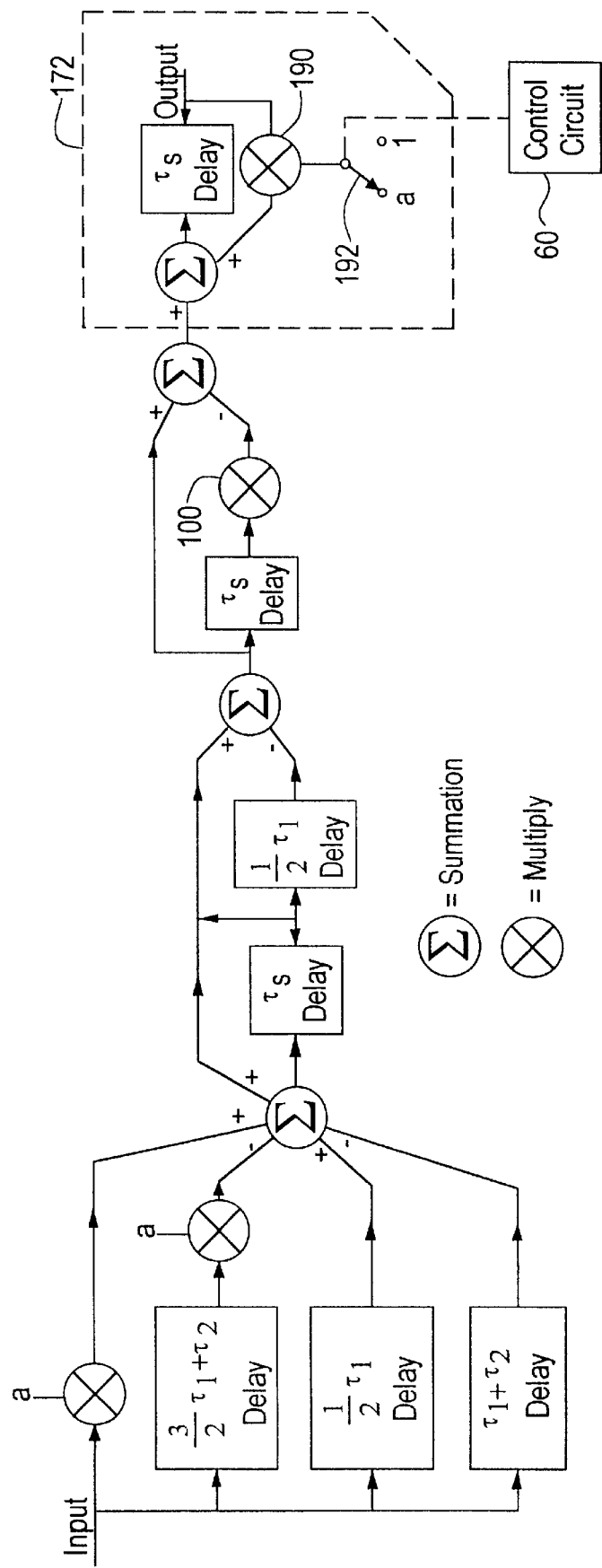
FIG. 7 is a view of the shaping filter similar to that shown in FIG. 2 with the last stage replaced by a simplified gated base line restorer circuit according to this invention.

In contrast, differencing circuit 170 takes the input X(i+1) and subtracts from the last previous input X(i) in summing circuit 174 to provide the difference V(i). One is taking the last output and adding it to the new signal to get the next output; the other is taking the next output and subtracting the last output to get the difference. Thus one can eliminate circuit 170 and circuit 180 and install weighting circuit 172 directly in place of output stage 80. This has been done and appears as shown in FIG. 7. An even more surprising advantage occurs here because the circuit that will be added, 172, is precisely the same as the circuit 80 that is taken out with the exception that a multiplier 190 and switch 192 has been added. The outcome is then that one can take the last stage of a conventional shaping filter 44, FIG. 2, simply add the multiplier 190 and switch 192 and have a base line restorer system of this invention which is faster, simpler, permits adjustment of the time constant of the base line restoration operation and provides an infinite historic average weighting, all by the simple addition of multiplier 190 and switch 192 as shown in FIG. 7.

Figure 8:
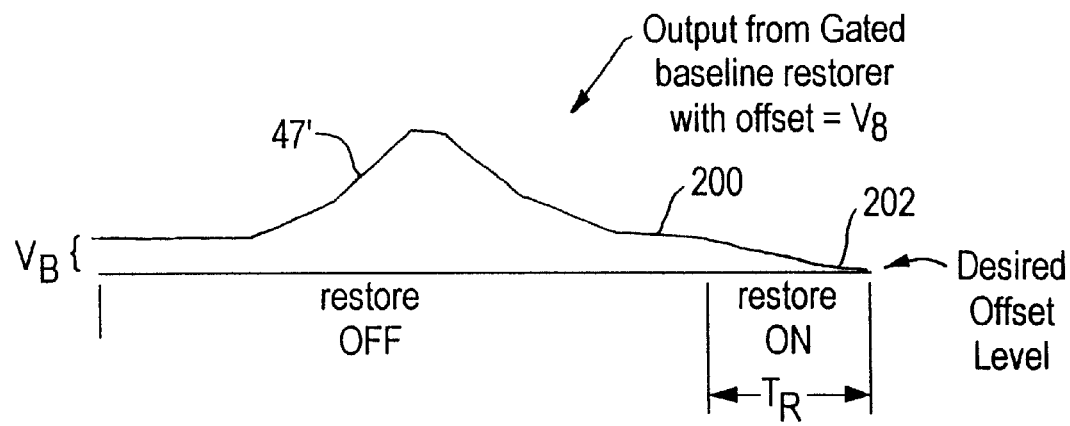
FIG. 8 illustrates the waveform at the output of the gated base line restorer.
Figure 9:
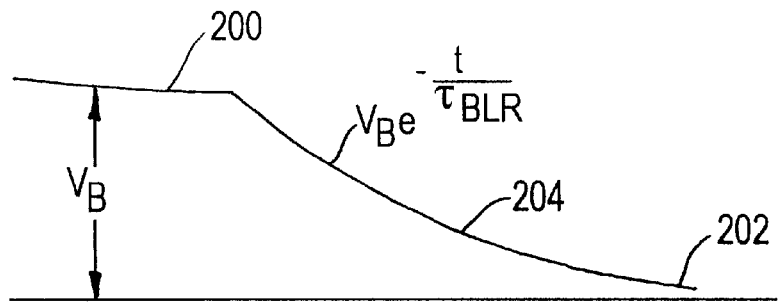
FIG. 9 is an exploded view of a portion of the waveform of FIG. 8.

The control that is exercised by the variation in the value of coefficient a can be seen more clearly with respects to FIGS. 8 and 9. FIG. 8 depicts the output 47' from gated base line restorer circuit 48, FIG. 1. There it can be seen that having started with an offset $V_B$, the gated base line restorer circuit 48 has acted during the period $T_R$, shown enlarged in FIG. 9, to restore the offset base 200 of pulse 47' to its proper level at 202. The slope of that return path is defined as $$V_B e^{-\frac{t}{\tau_{BLR}}}$$

where t is time, and $\tau_{BLR}$ is the time constant of the base line restorer circuit and is equal to $-\tau_S/\ln a$. Thus by varying a the steepness or shallowness of slope 204 can be adjusted for the desired time constant.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A digital gated base line restorer system for an ionizing radiation spectroscopy device, comprising:

a gated base line restorer circuit, responsive to pulses passing through the device, for generating a weighted average of previous base line sample points and applying it to the said pulses to compensate for base line offset errors; and a control circuit responsive to said pulses passing through the device to enable said gated base line restorer circuit to generate said weighted average during intervals between said pulses and apply it during said pulses.

2. The digital gated base line restorer system of claim 1 in which said gated base line restorer circuit includes a weighted averaging circuit for generating said weighted averaging and an adjustment circuit for applying said weighted average.

3. The digital gated base line restorer system of claim 2 in which said weighted averaging circuit includes a delay device for accumulating a number of previous sample points, a weighting device for weighting each previous sample point with a different weighting factor, a summing device for combining different weighted previous sample points, and an averaging device for providing the average of the differently weighted previous sample points.

4. The digital gated base line restorer system of claim 3 in which said delay device includes a shift register.

5. The digital gated base line restorer system of claim 3 in which said weighting device includes a plurality of multiplier circuits one for each weighting factor.

6. The digital gated base line restorer system of claim 3 in which said summing device includes an algebraic summing circuit.

7. The digital gated base line restorer system of claim 3 in which said averaging device includes a multiplier circuit for applying a normalizing factor of the reciprocal of the sum of said weighting factors.

8. The digital gated base line restorer system of claim 7 in which said summer device includes an algebraic summer circuit.

9. The digital gated base line restorer system of claim 2 in which said weighted averaging circuit includes a first delay circuit for delaying said sampling points, a summing circuit having one input for receiving the once delayed sample point from said first delay circuit, a second delay circuit, responsive to the output of said summing circuit for feeding back a twice delayed sample point to a second input of said summing circuit, and a weighting circuit for applying a weighting factor to the twice delayed sample point delivered to said second input of said summing circuit whereby more recent sample points are weighted more than older sample points.

10. The digital gated base line restorer system of claim 9 in which said weighted averaging circuit includes an averaging circuit, responsive to said summing circuit, for providing an average of the summed weighted sample points for generating said weighted average for applying to said pulses.

11. The digital gated base line restorer system of claim 9 in which said weighting factor is less than one.

12. The digital gated base line restorer system of claim 1 in which said gated base line restorer circuit includes a differencing device for delivering the difference between each present sample point and a previous sample point, and a weighting network for generating a weighted average of previous sample points and combining that weighted average with the difference between sample points and applying it to said digital pulses.

13. The digital gated base line restorer system of claim 12 in which said differencing device includes first delay means for delaying said sample point and summing means for subtracting the past sample point from the present sample point to obtain the difference.

14. The digital gated base line restorer system of claim 12 in which said weighted network includes second summing means having an input responsive to said difference between sample points and second delay means, responsive to the output of said second summing means, for feeding back the delayed difference to a second input of said second summing means, and a weighting component for applying a weighting factor to said delayed difference delivered to said second input of said second summing means for reducing said difference exponentially.

15. The digital gated base line restorer system of claim 14 in which said weighting network includes switch means responsive to said control circuit for applying said weighting factor only during sample points occurring during base line periods between said digital pulses.

16. The digital gated base line restorer system of claim 1 further comprising a shaping filter which includes an output stage having a summer element followed by a delay element and said gated base line restorer circuit including a weighting element for weighting the output of said filter and feeding it back to said summer element for producing a weighted average of base line sample points and applying it to said digital pulse to compensate for base line offset errors.

17. The digital gated base line restorer system of claim 16 in which said weighting element includes switching circuit responsive to said control circuit for applying said weighting factor only during base line periods between said digital pulses.

18. The digital gated base line restorer system of claim 2 in which said weighted averaging circuit includes a feedback circuit for recirculating a fraction of the base line restorer circuit outputs and weighting them diminishingly over time.

* * * * *